(12) United States Patent
Zhao (10) Patent No.: US 11,342,531 B2
(45) Date of Patent: May 24, 2022

(54) ORGANIC LIGHT EMITTING DIODE DISPLAY PANEL HAVING A TOUCH FUNCTION LAYER

(71) Applicant: WUHAN CHINA STAR OPTOELECTRONICS SEMICONDUCTOR DISPLAY TECHNOLOGY CO., LTD., Wuhan (CN)

(72) Inventor: Chen Zhao, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 523 days.

(21) Appl. No.: 16/343,563

(22) PCT Filed: Jan. 16, 2019

(86) PCT No.: PCT/CN2019/071968
§ 371 (c)(1),
(2) Date: Apr. 19, 2019

(87) PCT Pub. No.: WO2020/118849
PCT Pub. Date: Jun. 18, 2020

(65) Prior Publication Data
US 2021/0336201 A1   Oct. 28, 2021

(30) Foreign Application Priority Data
Dec. 13, 2018 (CN) .......................... 201811522027.1

(51) Int. Cl.
*H01L 51/52* (2006.01)
*H01L 27/14* (2006.01)
(Continued)

(52) U.S. Cl.
CPC ........ *H01L 51/5253* (2013.01); *H01L 27/323* (2013.01); *H01L 51/5246* (2013.01); *H01L 51/5293* (2013.01)

(58) Field of Classification Search
CPC ............. H01L 51/5253; H01L 51/5246; H01L 51/5293; H01L 2251/301; H01L 27/323;
(Continued)

(56) References Cited

U.S. PATENT DOCUMENTS 9,417,475 B2 * 8/2016 Fukutome ............. G06F 3/0443
10,818,738 B2 * 10/2020 Lee ..................... H01L 51/0097
(Continued)

FOREIGN PATENT DOCUMENTS

| CN | 107957813 A | 4/2018 |
|----|-------------|--------|
| EP | 3301553 A1 | 4/2018 |

*Primary Examiner* — Ida M Soward
(74) *Attorney, Agent, or Firm* — Kirton McConkie; Evan R. Witt (57) ABSTRACT

An organic light emitting diode (OLED) display panel, including an encapsulation layer, a polarizer, a touch function layer, an optical adhesive and a cover window, the polarizer is formed on the encapsulation layer. The touch function layer is formed on the polarizer. The optical adhesive is formed on the touch function layer. The cover window is formed on the optical adhesive. The touch function layer includes an inorganic protection sublayer, a first metal sublayer, a barrier sublayer, and a second metal sublayer formed on the polarizer in this order.

19 Claims, 3 Drawing Sheets

(51) Int. Cl.
*H01L 27/32* (2006.01)
*G02F 1/133* (2006.01)
*F21K 9/66* (2016.01)

(58) Field of Classification Search
CPC ......... H01L 27/14678; G02F 1/133528; G02F 1/133331; F21K 9/66
See application file for complete search history.

(56) References Cited

U.S. PATENT DOCUMENTS

| | | | |
|---|---|---|---|
| 10,824,256 B2* | 11/2020 | Choi | G06F 3/0416 |
| 2005/0140846 A1* | 6/2005 | Lubart | G02B 6/0053 |
| | | | 349/62 |
| 2016/0285042 A1* | 9/2016 | Choi | H01L 51/5246 |
| 2018/0004016 A1 | 1/2018 | Tada et al. | |
| 2018/0062094 A1 | 3/2018 | Kwon et al. | |
| 2018/0095566 A1 | 4/2018 | Lee et al. | |
| 2019/0179470 A1* | 6/2019 | Hong | G09G 3/3275 |
| 2020/0035757 A1* | 1/2020 | Lee | H01L 51/003 |
| 2020/0142530 A1* | 5/2020 | Lee | H01L 27/3262 |
| 2020/0203437 A1 | 6/2020 | Ye | |

* cited by examiner

ORGANIC LIGHT EMITTING DIODE DISPLAY PANEL HAVING A TOUCH FUNCTION LAYER

BACKGROUND OF INVENTION

Field of Invention

The present invention relates to the field of display technologies, and in particular, to an organic light emitting diode display panel.

Description of Prior Art

With the development of display technology, the requirements for color and lightness are getting higher and higher. Active matrix organic light emitting diode (AMOLED) displays are gradually entering the electrical consumer market, such as mobile devices and televisions. The OLED displays have high luminance, wide viewing angles, fast response times, ultra-thin, light weight characteristics, and can be fabricated on a flexible substrate.

Compared with traditional liquid crystal display (LCD) technology, the biggest advantage of OLED is that it can be made into a flexible product. The flexible OLED display panel mainly includes a cover window, a polarizer, a touch sensor, an OLED layer and a back plate. However, the thickness of the existing OLED display panel is too large, which is disadvantageous for the OLED display panel to be bent.

In order to further reduce the thickness of the entire panel and enhance bending characteristics of the OLED display panel, the present invention provides an OLED display panel to solve the above technical problems.

SUMMARY OF INVENTION

The present application provides an OLED display panel to solve the problem that the thickness of the existing OLED display panel is too large, which is disadvantageous for the OLED display panel to be bent.

The present application provides an organic light emitting diode (OLED) display panel, comprising:
an encapsulation layer;
a polarizer formed directly on the encapsulation layer;
a touch function layer formed directly on the polarizer;
an optical adhesive formed on the touch function layer; and
a cover window disposed on the optical adhesive;
wherein, the touch function layer comprises an inorganic protective sublayer, a first metal sublayer, a barrier sublayer, and a second metal sublayer formed on the polarizer in sequence;
the OLED display panel are disposed with a plurality of concavities, which extend at least through the inorganic protective sublayer; and
the barrier sublayer is made of an inorganic or organic material.

In the OLED display panel of the present application, the concavities penetrate the inorganic protective sublayer, and are filled with a material of the barrier sublayer.

In the OLED display panel of the present application, the concavities penetrate the inorganic protective sublayer and the polarizer, and the concavities are filled with a material of the barrier sublayer or filled with a material of the inorganic protective sublayer and a material of the barrier sublayer.

In the OLED display panel of the present application, the concavities comprise a first concavity formed on the polarizer and a second concavity formed on the inorganic protective sublayer corresponding to the first concave;
the first concavity penetrates the polarizer and is filled with a material of the inorganic protective sublayer;
the second concavity penetrates the inorganic protective sublayer and extends into the inorganic protective sublayer filled in the first concavity, and the second concavity is filled with a material of the barrier sublayer.

In the OLED display panel of the present application, the concavities penetrate through the barrier sublayer, the inorganic protective sublayer, and the polarizer, and the concavities are sequentially filled with a material of the inorganic protective sublayer, a material of the barrier sublayer, and an optical adhesive or sequentially filled with a material of the barrier sublayer and an optical adhesive.

In the OLED display panel of the present application, the concavities comprise a first concavity formed on the polarizer, a second concavity formed on the inorganic protective sublayer corresponding to the first concavity, and a third concavity formed in the barrier sublayer corresponding to the first concave;
the first concavity penetrates the polarizer, and filled with a material of an inorganic protective sublayer; the second concavity penetrates the inorganic protective sublayer and extends into the inorganic protective sublayer filled in the first concavity, and the second concavity is filled with a material of the barrier sublayer; the third concavity penetrates the barrier sublayer, the inorganic protective sublayer, and extends into the barrier sublayer filled in the second concavity, and the third concavity is filled with an optical adhesive.

In the OLED display panel of the present application, an opening area of the first concavity is increased from an end near the encapsulation layer toward an end away from the encapsulation layer.

In the OLED display panel of the present application, the concavities are holes or trench structures.

The present application further provides an organic light emitting diode (OLED) display panel, comprising:
an encapsulation layer;
a polarizer formed directly on the encapsulation layer;
a touch function layer formed directly on the polarizer;
an optical adhesive formed on the touch function layer; and
a cover window disposed on the optical adhesive;
wherein, the touch function layer comprises an inorganic protective sublayer, a first metal sublayer, a barrier sublayer, and a second metal sublayer formed on the polarizer in sequence.

In the OLED display panel of the present application, the OLED display panel are disposed with a plurality of concavities, which extend at least through the inorganic protective sublayer.

In the OLED display panel of the present application, the concavities penetrate the inorganic protective sublayer, and are filled with a material of the barrier sublayer.

In the OLED display panel of the present application, the concavities penetrate the inorganic protective sublayer and the polarizer, and the concavities are filled with a material of the barrier sublayer or filled with a material of the inorganic protective sublayer and a material of the barrier sublayer.

In the OLED display panel of the present application, the concavities comprise a first concavity formed on the polarizer and a second concavity formed on the inorganic protective sublayer corresponding to the first concave;

the first concavity penetrates the polarizer and is filled with a material of the inorganic protective sublayer;

the second concavity penetrates the inorganic protective sublayer and extends into the inorganic protective sublayer filled in the first concavity, and the second concavity is filled with a material of the barrier sublayer.

In the OLED display panel of the present application, the concavities penetrate through the barrier sublayer, the inorganic protective sublayer, and the polarizer, and the concavities are sequentially filled with a material of the inorganic protective sublayer, a material of the barrier sublayer, and an optical adhesive or sequentially filled with a material of the barrier sublayer and an optical adhesive.

In the OLED display panel of the present application, the concavities comprise a first concavity formed on the polarizer, a second concavity formed on the inorganic protective sublayer corresponding to the first concavity, and a third concavity formed in the barrier sublayer corresponding to the first concave;

the first concavity penetrates the polarizer, and filled with a material of an inorganic protective sublayer; the second concavity penetrates the inorganic protective sublayer and extends into the inorganic protective sublayer filled in the first concavity, and the second concavity is filled with a material of the barrier sublayer; the third concavity penetrates the barrier sublayer, the inorganic protective sublayer, and extends into the barrier sublayer filled in the second concavity, and the third concavity is filled with an optical adhesive.

In the OLED display panel of the present application, an opening area of the first concavity is increased from an end near the encapsulation layer toward an end away from the encapsulation layer.

In the OLED display panel of the present application, an opening area of the first concavity is increased from an end near the encapsulation layer toward an end away from the encapsulation layer.

In the OLED display panel of the present application, the barrier sublayer is made of an inorganic or organic material.

In the OLED display panel of the present application, the concavities are holes or trench structures.

Compared to the prior art OLED display panel, the OLED display panel of the present application is manufactured by directly preparing the polarizer and the touch function layer on the encapsulation layer, thereby reducing the thickness of the OLED display panel and improving the bending resistance of the OLED display panel. In addition, due to the arrangement of the concavities through the inorganic protective sublayer, the rigidity of the inorganic protective sublayer is reduced, and the flexibility of the OLED display panel is improved. At the same time, when the concavities penetrates the inorganic protective sublayer and the polarizer, the concavities are formed by the inorganic protective sublayer, so that the inorganic protective sublayer and the encapsulation layer are combined, thereby improving the waterproofing of the OLED display panel. The invention solves the technical problem that the existing OLED display panel has a large thickness and is not suitable for bending.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

Please refer to the attached drawings, in which the same reference numerals represent the same components. The following description is based on the specific embodiments of the present invention as illustrated, and should not be construed as limiting the specific embodiments that are not described herein.

Figure 1:
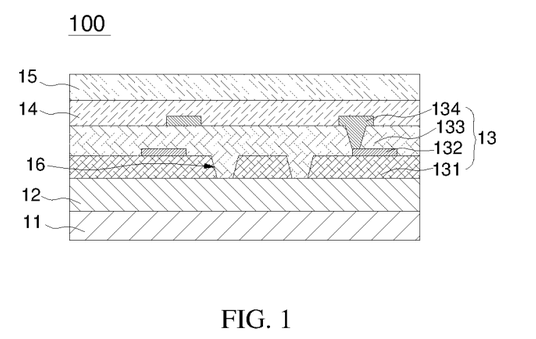
FIG. 1 is a schematic structural diagram of a first embodiment of an organic light emitting diode (OLED) display panel of the present application.

Please refer to FIG. 1, FIG. 1 is a schematic structural diagram of a first embodiment of an organic light emitting diode (OLED) display panel of the present application.

The OLED display panel 100 of the first embodiment of the present application includes an encapsulation layer 11, a polarizer 12, a touch function layer 13, an optical adhesive 14, and a cover window 15.

Wherein, the polarizer 12 is formed on the encapsulation layer 11. The touch function layer 13 is formed on the polarizer 12. The optical adhesive 14 is formed on the touch function layer 13. The cover window 15 is disposed on the optical adhesive 14.

The touch function layer 13 includes an inorganic protective sublayer 131, a first metal sublayer 132, a barrier sublayer 133, and a second metal sublayer 134 formed on the polarizer 12 in sequence.

In the first embodiment, by preparing the polarizer 12 and the touch function layer 13 directly on the encapsulation layer 11, the thickness of the OLED display panel 100 is reduced, and the bending resistance of the OLED display panel 100 is improved.

In the first embodiment, the polarizer 12 is a coated polarizer.

In the present application, the OLED display panel is spaced apart from the plurality of concavities, and the concavities penetrate at least the inorganic protective sublayer. In the first embodiment, the concavities 16 penetrate the inorganic protective sublayer 131, and are filled with a material of the barrier sublayer 133.

Because the arrangement of the concavities 16 through the inorganic protective sublayer 131, the overall rigidity of the inorganic protective sublayer 131 is reduced, and the flexibility of the OLED display panel 100 is improved.

The concavities 16 are holes or groove structures.

In the present first embodiment, the barrier sublayer 133 is made of an inorganic or organic material. In the first embodiment, the barrier sublayer 133 is made of an organic material, and the concavities 16 break the inorganic protective sublayer 131 such that the inorganic protective sublayer 131 does not have continuity to improve the bending resistance of the OLED display panel 100.

The manufacturing process of the OLED display panel 100 of the first embodiment includes the following steps.

First, the preparation of the thin film transistor array layer is performed on the substrate. Next, an anode, an electron hole injection layer, an electron hole transport layer, an organic light emitting layer, an electron transport layer, an electron injection layer, and a cathode are sequentially formed on the thin film transistor array layer to complete preparation of the OLED device.

Next, the encapsulation layer 11 is formed on the OLED device by a chemical vapor deposition process, an atomic layer deposition process, a vacuum evaporation process, or an inkjet printing process.

Then, a coated polarizer 12 is prepared on the encapsulation layer 11. The coated polarizer 12 is composed of a linear polarizer and a phase retarder. A phase retarder was prepared by coating on the encapsulation layer 11, and then a line polarizer was coated on the phase retardation sheet by an anti-solvent method.

Next, the touch function layer 13 is prepared on the coated polarizer 12. First, an inorganic protective sublayer 131 is formed on the polarizer 12, and concavities 16 are formed on the inorganic protective sublayer 131 through a mask and a photolithography process or by an etching process. Thereafter, a first metal sublayer 132 is formed on the inorganic protective sublayer 131. Next, a barrier sublayer 133 is formed on the first metal sublayer 132, and a portion of the material of the barrier sublayer 133 fills the concavities 16. Subsequently, a second metal sublayer 134 is formed on the barrier sublayer 133 to form the touch function layer 13.

Finally, a layer of optical adhesive 14 is prepared on the touch function layer 13, and the cover window 15 is attached to the optical adhesive 14.

Thus, the preparation process of the OLED display panel 100 of the first embodiment is completed.

Figure 2:
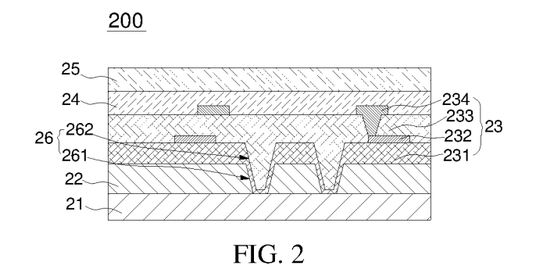
FIG. 2 is a schematic structural diagram of a second embodiment of an OLED display panel of the present application.

Please refer to FIG. 2. FIG. 2 is a schematic structural diagram of a second embodiment of an OLED display panel of the present application. The OLED display panel 200 of the second embodiment includes an encapsulation layer 21, a polarizer 22, a touch function layer 23, an optical adhesive 24, and a cover window 25. The touch function layer 23 includes an inorganic protective sublayer 231, a first metal sublayer 232, a barrier sublayer 233, and a second metal sublayer 234 which are sequentially formed on the polarizer 22.

The second embodiment is different from the first embodiment in that the concavities 26 penetrate the inorganic protective sublayer 231 and the polarizer 22. The concavities 26 are filled with a material of the barrier sublayer or filled with a material of the inorganic protective sublayer 231 and a material of the barrier sublayer 233.

On one hand, the OLED display panel 200 of the second embodiment enhances the bending resistance of the OLED display panel 200 by deepening the concavities 26 to penetrate the polarizer 22. On the other hand, the material of the inorganic protective sublayer 231 is applied on the concavities 26 to make the inorganic sublayer 231 have continuity, thereby ensuring the performance of preventing water and oxygen from invading and enhancing the encapsulation effect. Further, the material of the inorganic protective sublayer 231 and the barrier sublayer 233 is sequentially filled on the concavities 26 to combine the material of the inorganic protective sublayer 231 and the barrier sublayer 233 with the encapsulation layer 21, thereby improving the waterproofing of the OLED display panel.

Of course, in the OLED display panel of the present application, the concavities can also be filled with a material of barrier sublayer. Compared with the arrangement that the concavities are filled with a material of the barrier sublayer or filled with a material of the inorganic protective sublayer and a material of the barrier sublayer, such an arrangement improves the bending resistance.

Figure 3:
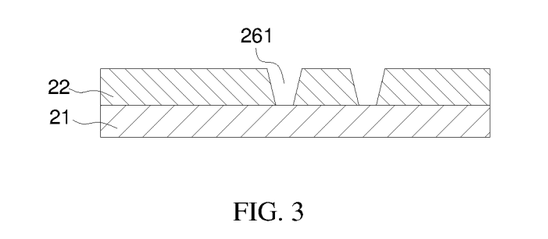
FIG. 3 is a schematic structural diagram of a step of completing a polarizer according to the second embodiment of the OLED display panel of the present application.
Figure 4:
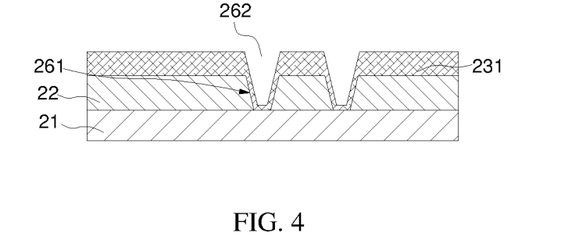
FIG. 4 is a schematic structural diagram of a step of completing an inorganic protective sublayer according to the second embodiment of the OLED display panel of the present application.
Figure 5:
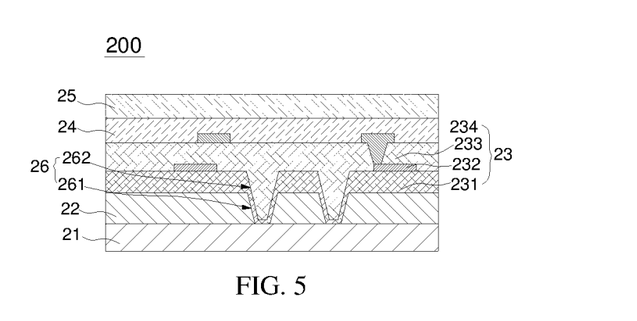
FIG. 5 is a schematic structural diagram of a step of completing a cover window according to the second embodiment of the OLED display panel of the present application.

In the second embodiment, specifically, referring to FIG. 3 to FIG. 5, the concavities 26 comprise a first concavity 261 formed on the polarizer 22 and a second concavity 262 formed on the inorganic protective sublayer 231 corresponding to the first concave 261.

The first concavity 261 penetrates the polarizer 22 and is filled with a material of the inorganic protective sublayer 261. The second concavity 262 penetrates the inorganic protective sublayer 231 and extends into the inorganic protective sublayer 231 filled in the first concavity 261, and the second concavity 261 is filled with a material of the barrier sublayer 233.

In the second embodiment, the opening area of the first concavity 261 is increased from an end near the encapsulation layer 21 toward an end remote from the encapsulation layer 21. Such an arrangement can reduce the opening area on the polarizer 22 and to avoid affecting the self-function of the polarizer 22. Optionally, the longitudinal cross-sectional shapes of the first concavity 261 and the second concavity 262 are all isosceles trapezoids. Of course, in the present application, the longitudinal cross-sections of the first concavity 261 and the second concavity 262 may also have other shapes, such as a rectangular shape, a right-angled trapezoid, and the like.

The manufacturing process of the OLED display panel 200 of the second embodiment includes the following steps.

First, the preparation of the thin film transistor array layer is performed on the substrate. Next, an anode, an electron hole injection layer, an electron hole transport layer, an organic light emitting layer, an electron transport layer, an electron injection layer, and a cathode are sequentially formed on the thin film transistor array layer to complete preparation of the OLED device.

Next, the encapsulation layer 21 is formed on the OLED device by a chemical vapor deposition process, an atomic layer deposition process, a vacuum evaporation process, or an inkjet printing process.

Then, a coated polarizer 22 is prepared on the encapsulation layer 11. The coated polarizer 22 is composed of a linear polarizer and a phase retarder. A phase retarder was prepared by coating on the encapsulation layer 21, and then a line polarizer was coated on the phase retardation sheet by an anti-solvent method. Thereafter, a plurality of spaced first concavities 261 are formed on the polarizer 22 by an etching process. Please refer to FIG. 3.

Next, the touch function layer 23 is prepared on the coated polarizer 22. Please refer to FIG. 4. First, an inorganic protective sublayer 231 is formed on the polarizer 12, and a portion of the material of the inorganic protective sublayer 231 is filled in the first concavity 261. The second concavity 262 is formed in a region of the inorganic protective sublayer 231 corresponding to the first concavity 261 by a mask and a photolithography process, and the second concavity 262 extends into the inorganic protective sublayer 231 filled in the first concavity 261. Thereafter, a first metal sublayer 232 is formed on the inorganic protective sublayer 231. Next, a barrier sublayer 233 is formed on the first metal sublayer 232, and a portion of the material of the barrier sublayer 233 fills the second recess 262. Subsequently, a second metal sublayer 324 is formed on the barrier sublayer 233 to form the touch function layer 23. The first concavity 261 and the second concavity 262 are superposed to form concavities 26.

Finally, referring to FIG. 5, a layer of optical adhesive 24 is prepared on the touch function layer 23, and the cover window 25 is attached to the optical adhesive 24.

Thus, the preparation process of the OLED display panel 200 of the second embodiment is completed.

Figure 6:
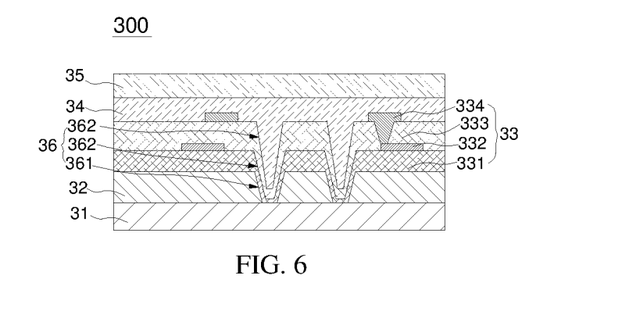
FIG. 6 is a schematic structural diagram of a third embodiment of an OLED display panel of the present application.

Please refer to FIG. 6. FIG. 6 is a schematic structural diagram of a third embodiment of an OLED display panel of the present application. The OLED display panel 300 of the third embodiment includes an encapsulation layer 31, a polarizer 32, a touch function layer 33, an optical adhesive 34, and a cover window 35. The touch function layer 33 includes an inorganic protective sublayer 331, a first metal sublayer 332, a barrier sublayer 333, and a second metal sublayer 334 which are sequentially formed on the polarizer 32.

The third embodiment is different from the second embodiment in that, in the third embodiment, the concavities 36 penetrate through the barrier sublayer 333, the inorganic protective sublayer 331 and the polarizer 32. The concavities 36 are sequentially filled with a material of the inorganic protective sublayer 331, a material of the barrier sublayer 333, and an optical adhesive 34 or sequentially filled with a material of the barrier sublayer 333 and an optical adhesive 34. In the third embodiment, the concavities 36 filled with the material of the inorganic protective sublayer 331, the material of the barrier sublayer 333, and the optical adhesive 34 is described as an example.

On one hand, the OLED display panel 300 of the third embodiment enhances the bending resistance of the OLED display panel 200 by deepening the concavities 26 to penetrate the barrier sublayer 333, the inorganic protective sublayer 331 and the polarizer 32. On the other hand, the material of the inorganic protective sublayer 331, the barrier sublayer 333 and the optical adhesive 34 is sequentially filled on the concavities 36 to combine the material of the inorganic protective sublayer 331, the barrier sublayer 333 and the optical adhesive 34 with the encapsulation layer 31, thereby improving the waterproofing of the OLED display panel.

In the third embodiment, the concavities include a first concavity 361 formed on the polarizer 32, a second concavity 362 formed on the inorganic protective sublayer 362 corresponding to the first concavity 361, and a third concavity 363 formed in the barrier sublayer 333 corresponding to the first concavity 361.

The first concavity 361 penetrates the polarizer 32, and filled with a material of an inorganic protective sublayer 331; the second concavity 362 penetrates the inorganic protective sublayer 331 and extends into the inorganic protective sublayer 362 filled in the first concavity 361, and the second concavity 362 is filled with a material of the barrier sublayer 333; the third concavity 363 penetrates the barrier sublayer 333, the inorganic protective sublayer 331, and extends into the barrier sublayer 333 filled in the second concavity 362, and the third concavity 363 is filled with an optical adhesive 34.

By providing the second concavity 362 and the third concavity 363 corresponding to the region of the first concavity 361, the effect of superposing the first concavity 361, the second concavity 362, and the third concavity 363 is obtained, thereby, the depth of the concavity 36 is deepened.

The manufacturing process of the OLED display panel 300 of the third embodiment includes the following steps.

First, the preparation of the thin film transistor array layer is performed on the substrate. Next, an anode, an electron hole injection layer, an electron hole transport layer, an organic light emitting layer, an electron transport layer, an electron injection layer, and a cathode are sequentially formed on the thin film transistor array layer to complete preparation of the OLED device.

Next, the encapsulation layer 31 is formed on the OLED device by a chemical vapor deposition process, an atomic layer deposition process, a vacuum evaporation process, or an inkjet printing process.

Figure 7:
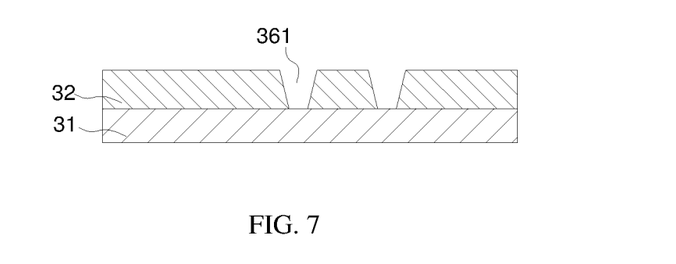
FIG. 7 is a schematic structural diagram of a step of completing a polarizer according to the third embodiment of the OLED display panel of the present application.

Then, a coated polarizer 32 is prepared on the encapsulation layer 11. The coated polarizer 22 is composed of a linear polarizer and a phase retarder. A phase retarder was prepared by coating on the encapsulation layer 31, and then a line polarizer was coated on the phase retardation sheet by an anti-solvent method. Thereafter, a plurality of spaced first concavities 361 are formed on the polarizer 32 by an etching process. Please refer to FIG. 7.

Figure 8:
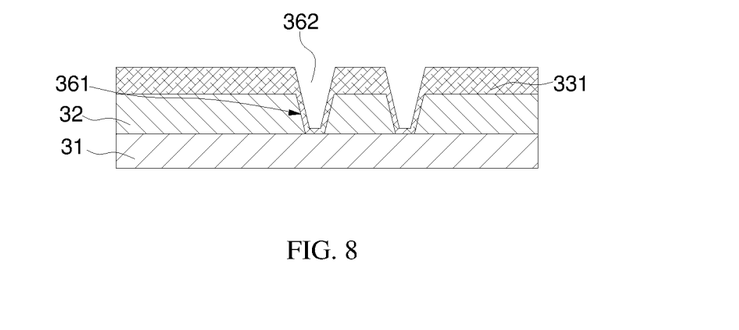
FIG. 8 is a schematic structural diagram of completing an inorganic protective sublayer according to the third embodiment of the OLED display panel of the present application.
Figure 9:
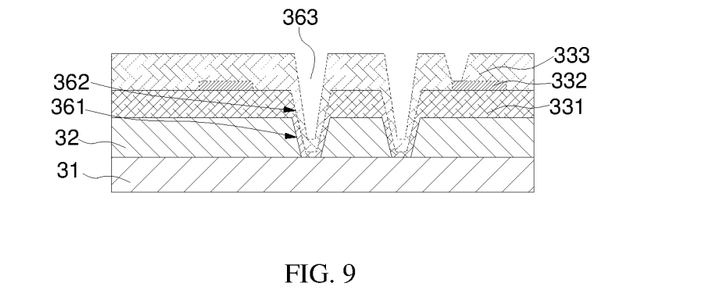
FIG. 9 is a schematic structural diagram of a step of completing a barrier sublayer according to the third embodiment of the OLED display panel of the present application.

Next, the touch function layer 33 is prepared on the coated polarizer 32. Please refer to FIG. 8. First, an inorganic protective sublayer 231 is formed on the polarizer 32, and a portion of the material of the inorganic protective sublayer 231 is filled in the first concavity 361. The second concavity 362 is formed in a region of the inorganic protective sublayer 331 corresponding to the first concavity 361 by a mask and a photolithography process, and the second concavity 362 extends into the inorganic protective sublayer 331 filled in the first concavity 261. Thereafter, a first metal sublayer 232 is formed on the inorganic protective sublayer 331. Next, a barrier sublayer 333 is formed on the first metal sublayer 332, and a portion of the material of the barrier sublayer 333 fills the second concavity 362. Subsequently, referring to FIG. 9, a third concavity 363 is formed in a region of the barrier sublayer 333 corresponding to the first concavity 361 by a mask and a photolithography process, the third concavity 363 extends into the barrier sublayer 333 filled in the second concavity 362 and a second metal sublayer 334 is then formed on the barrier sublayer 333 to form the touch function layer 33.

Figure 10:
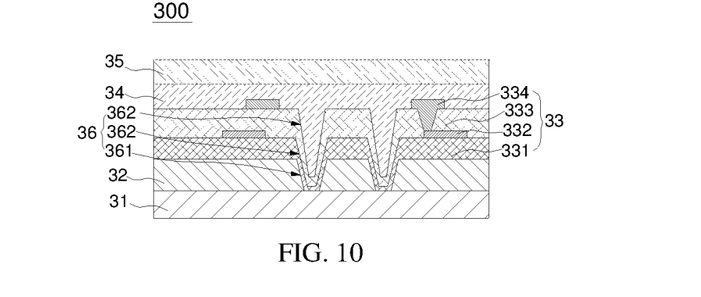
FIG. 10 is a schematic structural diagram of a step of completing a cover window according to the third embodiment of the OLED display panel of the present application.

Finally, referring to FIG. 10, a layer of optical adhesive 34 is prepared on the touch function layer 33, and the cover window 35 is attached to the optical adhesive 34.

Thus, the preparation process of the OLED display panel 300 of the third embodiment is completed.

Compared to the prior art OLED display panel, the OLED display panel of the present application is manufactured by directly preparing the polarizer and the touch function layer on the encapsulation layer, thereby reducing the thickness of the OLED display panel and improving the bending resistance of the OLED display panel. In addition, due to the arrangement of the concavities through the inorganic protective sublayer, the rigidity of the inorganic protective sublayer is reduced, and the flexibility of the OLED display panel is improved. At the same time, when the concavities penetrates the inorganic protective sublayer and the polarizer, the concavities are formed by the inorganic protective sublayer, so that the inorganic protective sublayer and the encapsulation layer are combined, thereby improving the waterproofing of the OLED display panel. The invention solves the technical problem that the existing OLED display panel has a large thickness and is not suitable for bending.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. An organic light emitting diode (OLED) display panel, comprising:
   an encapsulation layer;
   a polarizer formed directly on the encapsulation layer;
   a touch function layer formed directly on the polarizer;
   an optical adhesive formed on the touch function layer; and
   a cover window disposed on the optical adhesive;
   wherein, the touch function layer comprises an inorganic protective sublayer, a first metal sublayer, a barrier sublayer, and a second metal sublayer formed on the polarizer in sequence;
   the OLED display panel are disposed with a plurality of concavities, which extend at least through the inorganic protective sublayer; and
   the barrier sublayer is made of an inorganic or organic material.

2. The OLED display panel according to claim 1, wherein the concavities penetrate the inorganic protective sublayer, and are filled with a material of the barrier sublayer.

3. The OLED display panel according to claim 1, wherein the concavities penetrate the inorganic protective sublayer and the polarizer, and the concavities are filled with a material of the barrier sublayer or filled with a material of the inorganic protective sublayer and a material of the barrier sublayer.

4. The OLED display panel according to claim 3, wherein the concavities comprise a first concavity formed on the polarizer and a second concavity formed on the inorganic protective sublayer corresponding to the first concave;
   the first concavity penetrates the polarizer and is filled with a material of the inorganic protective sublayer;
   the second concavity penetrates the inorganic protective sublayer and extends into the inorganic protective sublayer filled in the first concavity, and the second concavity is filled with a material of the barrier sublayer.

5. The OLED display panel according to claim 1, wherein the concavities penetrate through the barrier sublayer, the inorganic protective sublayer, and the polarizer, and the concavities are sequentially filled with a material of the inorganic protective sublayer, a material of the barrier sublayer, and an optical adhesive or sequentially filled with a material of the barrier sublayer and an optical adhesive.

6. The OLED display panel according to claim 5, wherein the concavities comprise a first concavity formed on the polarizer, a second concavity formed on the inorganic protective sublayer corresponding to the first concavity, and a third concavity formed in the barrier sublayer corresponding to the first concave;
   the first concavity penetrates the polarizer, and filled with a material of an inorganic protective sublayer; the second concavity penetrates the inorganic protective sublayer and extends into the inorganic protective sublayer filled in the first concavity, and the second concavity is filled with a material of the barrier sublayer; the third concavity penetrates the barrier sublayer, the inorganic protective sublayer, and extends into the barrier sublayer filled in the second concavity, and the third concavity is filled with an optical adhesive.

7. The OLED display panel according to claim 4, wherein an opening area of the first concavity is increased from an end near the encapsulation layer toward an end away from the encapsulation layer.

8. The OLED display panel of claim 1, wherein the concavities are holes or trench structures.

9. An organic light emitting diode (OLED) display panel, comprising:
   an encapsulation layer;
   a polarizer formed directly on the encapsulation layer;
   a touch function layer formed directly on the polarizer;
   an optical adhesive formed on the touch function layer; and
   a cover window disposed on the optical adhesive;
   wherein, the touch function layer comprises an inorganic protective sublayer, a first metal sublayer, a barrier sublayer, and a second metal sublayer formed on the polarizer in sequence.

10. The OLED display panel according to claim 9, wherein the OLED display panel are disposed with a plurality of concavities, which extend at least through the inorganic protective sublayer.

11. The OLED display panel according to claim 10, wherein the concavities penetrate the inorganic protective sublayer, and are filled with a material of the barrier sublayer.

12. The OLED display panel according to claim 10, wherein the concavities penetrate the inorganic protective sublayer and the polarizer, and the concavities are filled with a material of the barrier sublayer or filled with a material of the inorganic protective sublayer and a material of the barrier sublayer.

13. The OLED display panel according to claim 12, wherein the concavities comprise a first concavity formed on the polarizer and a second concavity formed on the inorganic protective sublayer corresponding to the first concave;
   the first concavity penetrates the polarizer and is filled with a material of the inorganic protective sublayer;
   the second concavity penetrates the inorganic protective sublayer and extends into the inorganic protective sublayer filled in the first concavity, and the second concavity is filled with a material of the barrier sublayer.

14. The OLED display panel according to claim 10, wherein the concavities penetrate through the barrier sublayer, the inorganic protective sublayer, and the polarizer, and the concavities are sequentially filled with a material of the inorganic protective sublayer, a material of the barrier sublayer, and an optical adhesive or sequentially filled with a material of the barrier sublayer and an optical adhesive.

15. The OLED display panel according to claim 14, wherein the concavities comprise a first concavity formed on the polarizer, a second concavity formed on the inorganic protective sublayer corresponding to the first concavity, and a third concavity formed in the barrier sublayer corresponding to the first concave;

the first concavity penetrates the polarizer, and filled with a material of an inorganic protective sublayer; the second concavity penetrates the inorganic protective sublayer and extends into the inorganic protective sublayer filled in the first concavity, and the second concavity is filled with a material of the barrier sublayer; the third concavity penetrates the barrier sublayer, the inorganic protective sublayer, and extends into the barrier sublayer filled in the second concavity, and the third concavity is filled with an optical adhesive.

16. The OLED display panel according to claim 15, wherein an opening area of the first concavity is increased from an end near the encapsulation layer toward an end away from the encapsulation layer.

17. The OLED display panel according to claim 13, wherein an opening area of the first concavity is increased from an end near the encapsulation layer toward an end away from the encapsulation layer.

18. The OLED display panel according to claim 9, wherein the barrier sublayer is made of an inorganic or organic material.

19. The OLED display panel of claim 10, wherein the concavities are holes or trench structures.

* * * * *